United States Patent
Zhang et al.

(10) Patent No.: US 11,774,470 B2
(45) Date of Patent: Oct. 3, 2023

(54) LOAD DETECTION SYSTEM AND LOAD DETECTION METHOD THEREOF

(71) Applicant: JIANGSU ZIMI SOFTWARE TECHNOLOGY CO., LTD., Jiangsu (CN)

(72) Inventors: Feng Zhang, Shanghai (CN); Maonan Yao, Suzhou (CN)

(73) Assignee: JIANGSU ZIMI SOFTWARE TECHNOLOGY CO., LTD., Jiangsu (CN)

( * ) Notice: Subject to any disclaimer, the term of this patent is extended or adjusted under 35 U.S.C. 154(b) by 165 days.

(21) Appl. No.: 17/420,881

(22) PCT Filed: Aug. 30, 2019

(86) PCT No.: PCT/CN2019/103488
§ 371 (c)(1),
(2) Date: Jul. 6, 2021

(87) PCT Pub. No.: WO2020/181739
PCT Pub. Date: Sep. 17, 2020

(65) Prior Publication Data
US 2022/0074977 A1   Mar. 10, 2022

(30) Foreign Application Priority Data
Mar. 11, 2019   (CN) .......................... 201910181024.4

(51) Int. Cl.
*G01R 19/25*     (2006.01)
*G01R 27/16*     (2006.01)
(52) U.S. Cl.
CPC ......... *G01R 19/2513* (2013.01); *G01R 27/16* (2013.01)

(58) Field of Classification Search
CPC .... G01R 19/2513; G01R 27/16; G01R 27/02; G01R 19/145; G01R 31/66; H02J 7/00038
(Continued)

(56) References Cited

U.S. PATENT DOCUMENTS

| | | |
|---|---|---|
| 5,397,999 A | 3/1995 | Kanamaru |
| 6,081,123 A | 6/2000 | Kasbarian et al. |

(Continued)

FOREIGN PATENT DOCUMENTS

| | | |
|---|---|---|
| CN | 103698640 A | 4/2014 |
| CN | 103954861 A | 7/2014 |

(Continued)

OTHER PUBLICATIONS

European Patent Application No. 19918537.2 extended Search and Opinion dated Apr. 7, 2022, 10 pages.

(Continued)

*Primary Examiner* — Giovanni Astacio-Oquendo
(74) *Attorney, Agent, or Firm* — COZEN O'CONNOR (57) ABSTRACT

Provided are a load detection system and a load detection method thereof. The load detection system includes an adjustable power supply (110) and a detection module (12). The adjustable power supply (110) and a to-be-detected load 120 together form a set load detection circuit (11), and the adjustable power supply (110) is configured to output a changing power supply signal to the to-be-detected load (120) through the set load detection circuit (11). The detection module (12) is configured to detect at least two changing electrical parameters in the set load detection circuit (11), acquire an equivalent resistance value of the to-be-detected load (120) according to the at least two changing electrical parameters, and detect whether the to-be-detected load (120) includes a charging device according to a non- (Continued)

linear change curve or a linear change curve formed by the equivalent resistance value and the power supply signal.

20 Claims, 3 Drawing Sheets

(58) Field of Classification Search
USPC ............................... 324/705, 691, 649, 600
See application file for complete search history.

(56) References Cited

U.S. PATENT DOCUMENTS

| | | | |
|---|---|---|---|
| 9,236,762 B2* | 1/2016 | John | ............... H05B 47/175 |
| 2009/0009187 A1 | 1/2009 | Kwak | |
| 2016/0195578 A1* | 7/2016 | Huang | ............... G01R 27/14 |
| | | | 320/134 |
| 2020/0103445 A1* | 4/2020 | Medina Garcia | ...... G01R 27/16 |
| 2022/0035390 A1* | 2/2022 | Chamberlain | ......... H02H 9/045 |
| 2022/0229098 A1* | 7/2022 | Suelzle | .................. G01R 27/08 |
| 2023/0123385 A1* | 4/2023 | Cahill | .................. G01R 21/133 |
| | | | 702/60 |

FOREIGN PATENT DOCUMENTS

| | | |
|---|---|---|
| CN | 104767270 A | 7/2015 |
| CN | 105137356 A | 12/2015 |
| CN | 106253398 A | 12/2016 |
| CN | 106546822 A | 3/2017 |
| CN | 109828173 A | 5/2019 |

OTHER PUBLICATIONS

International Search report dated Oct. 30, 2019 issued in PCT/CN2019/103488 filed on Aug. 30, 2019.
First Office Action issued on for Chinese Patent Application No. 201910181024.4.

* cited by examiner

An adjustable power supply outputs a changing power supply signal to a to-be-detected load through a set load detection circuit

S602

A detection module detects at least two changing electrical parameters in the set load detection circuit, acquires an equivalent resistance value of the to-be-detected load according to the changing electrical parameters, and detects whether the to-be-detected load includes a charging device according to a non-linear change curve or a linear change curve formed by the equivalent resistance value and the power supply signal

FIG. 6

LOAD DETECTION SYSTEM AND LOAD DETECTION METHOD THEREOF

CROSS-REFERENCE TO RELATED APPLICATIONS

This is a National Stage Application filed under 35 U.S.C. 371 based on International Patent Application No. PCT/CN2019/103488, filed on Aug. 30, 2019, which claims priority to Chinese Patent Application No. 201910181024.4 filed on Mar. 11, 2019, disclosures of both of which are incorporated herein by reference in their entireties.

TECHNICAL FIELD

Embodiments of the present application relate to the technical field of load detection, for example, a load detection system and a load detection method thereof.

BACKGROUND

In the related art, most users want charging tools such as chargers and mobile power sources to automatically charge charging devices after the charging devices are inserted and also want charging tools to automatically detect whether charging devices are inserted when the multi-port adapter shares the power supply, so that power can be dynamically allocated to different ports.

The common methods for identifying whether a charging device is inserted include the following two methods. (1) A mechanical structure is added on the interface mechanism in the related art to detect the insertion action of the charging device. For example, a spring is added on the USB Type-A interface to detect whether the charging device is inserted. However, such a method of adding a mechanical structure generally detects the insertion of the charging device only by detecting the insertion of the charging wire. Once the charging wire is inserted and then the charging device is inserted into the charging wire, the mechanical structure cannot detect the charging device. (2) Whether the charging device is inserted is determined by detecting the impedance between the power supply at the interface and the ground. This detection method, based on a standard interface, determines the state of the load through the changes in the interface impedance. However, since some charging systems (for example, systems of charging wire+charging device) include a circuit and a path metal oxide semiconductor (MOS) in their charging wires, the interface would mistakenly determine that a charging device has already been inserted once the charging wire is inserted, and thus performs no further detection mechanism after the charging device is inserted, so the interface cannot accurately detect whether the charging wire is inserted into the interface or whether both the charging wire and the charging device are inserted into the interface.

SUMMARY

The following is a summary of the subject matter described herein in detail. This summary is not intended to limit the scope of the claims.

The present application provides a load detection system and a load detection method thereof to avoid a case in which a detection system having a mechanical structure cannot detect whether a charging device is inserted after detecting that a charging wire has been inserted into the detection system and a case in which the detection system, according to the impedance change, mistakenly determines the insertion of a charging wire to be the insertion of a charging device, thereby accurately detecting whether the charging wire is inserted into the load detection system or whether both the charging wire and the charging device are inserted into the load detection system.

In a first aspect, an embodiment of the present application provides a load detection system. The load detection system includes an adjustable power supply and a detection module. The adjustable power supply and a to-be-detected load together form a set load detection circuit, and the adjustable power supply is configured to output a changing power supply signal to the to-be-detected load through the set load detection circuit. The detection module is configured to detect at least two changing electrical parameters in the set load detection circuit, acquire an equivalent resistance value of the to-be-detected load according to the at least two changing electrical parameters, and detect whether the to-be-detected load includes a charging device according to a non-linear change curve or a linear change curve formed by the equivalent resistance value and the power supply signal.

In a second aspect, an embodiment of the present application further provides a load detection method of the load detection system described in the first aspect. The load detection method includes: outputting, by an adjustable power supply, a changing power supply signal to a to-be-detected load through a set load detection circuit; and detecting, by a detection module, at least two changing electrical parameters in the set load detection circuit, acquiring an equivalent resistance value of the to-be-detected load according to the at least two changing electrical parameters, and detecting whether the to-be-detected load includes a charging device according to a non-linear change curve formed by the equivalent resistance value and the power supply signal or a linear change curve formed by the equivalent resistance value and the power supply signal.

Other aspects can be understood after the drawings and the detailed description are read and understood.

DETAILED DESCRIPTION

The present application is further described in detail hereinafter in connection with drawings and embodiments. It is to be understood that the embodiments described herein are intended to illustrate and not to limit the present application. It is to be noted that to facilitate description, only part, not all, of structures related to the present application are illustrated in the drawings.

Figure 1:
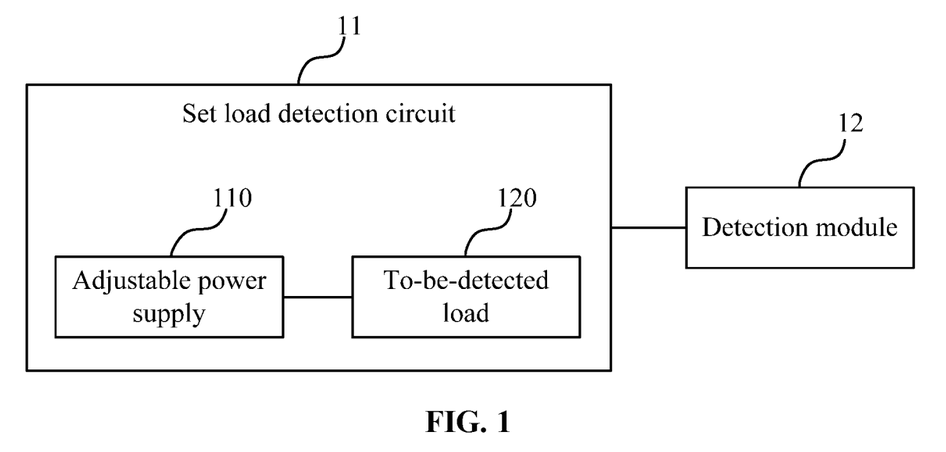
FIG. 1 is a structural diagram of a load detection system according to an embodiment of the present application.

FIG. 1 is a structural diagram of a load detection system according to an embodiment of the present application. As shown in FIG. 1, the load detection system includes an adjustable power supply 110 and a detection module 12. The adjustable power supply 110 and a to-be-detected load 120 together form a set load detection circuit 11, and the adjustable power supply 110 is configured to output a SUBSTITUTE SPECIFICATION 4 CLEAN changing power supply signal to the to-be-detected load 120 through the set load detection circuit 11. The detection module 12 is configured to detect at least two changing electrical parameters in the set load detection circuit 11, acquire an equivalent resistance value of the to-be-detected load 120 according to the at least two changing electrical parameters, and detect whether the to-be-detected load includes a charging device according to a non-linear change curve or a linear change curve formed by the equivalent resistance value and the power supply signal.

Since, in the related art, the equivalent resistance value of the to-be-detected load is constant by default and there is a linear relationship between the equivalent resistance value and the power supply signal, when the mechanical structure is used for detection and if the to-be-detected load is inserted into the load detection system, the load detection system performs detection only once and then performs no subsequent operation. Under such a circumstance, if the to-be-detected load is a charging wire, after the charging wire is inserted into the load detection system, the load detection system detects that a to-be-detected device has been inserted, and when a charging device such as a mobile phone or a bracelet is inserted into the charging wire, the load detection system does not perform any detection on the inserted device, which results in that the detection mechanism using the mechanical structure for detection cannot accurately determine whether a device to be charged are inserted.

When the detection is performed using the method based on the impedance change, if the load detection system detects that the equivalent resistance value is zero, the load detection system directly determines that the to-be-detected load is not yet inserted; if the load detection system detects that the equivalent resistance value is not zero, the load detection system directly determines that the to-be-detected load has been inserted. However, since both the charging wire and the charging device have resistance, the load detection system cannot determine whether the charging wire or the charging device is inserted into the load detection system. When not the charging device but only the charging wire is inserted, the load detection system still outputs the power supply signal, which causes misjudgment.

In the present application, the to-be-detected load is set as a non-linear device, and a power supply of the load detection circuit is set as an adjustable power supply. In a case where whether a charging wire or a charging wire plus a charging device are inserted into the load detection system is not determined, the adjustable power supply outputs a changing power supply signal, and the detection module detects at least two changing parameters in the set load detection circuit and calculates an equivalent resistance value of the to-be-detected load according to the detected changing electrical parameters through a preset algorithm. The change curve of the equivalent resistance value changing with the power supply signal outputted by the adjustable power supply is a non-linear change curve and the non-linear change curve of the inserted charging wire is different from the non-linear change curve of the inserted charging wire plus the charging device, so the detection module can determine whether the to-be-detected load is the charging wire or the charging wire plus the charging device according to the obtained non-linear change curve.

It is to be noted that in the related art, since the load detection system performs detection only once and after that performs no subsequent operation, it is not possible to determine whether the to-be-detected load is the charging wire or the charging wire plus the charging device even if the equivalent resistance value and the power supply signal are in a linear relationship. In the present application, the adjustable power supply outputs a changing power supply signal, and the detection module detects at least two changing parameters in the set load detection circuit and calculates an equivalent resistance value of the to-be-detected load according to the detected changing electrical parameters through a preset algorithm. Since the change curve of the equivalent resistance value changing with the power supply signal outputted by the adjustable power supply may be a non-linear change curve and may also be a linear change curve and the linear change curve of the inserted charging wire is different from the linear change curve of the inserted charging wire plus the charging device, the detection module can determine whether the to-be-detected load is the charging wire or the charging wire plus the charging device according to the obtained linear change curve.

When the to-be-detected load is a linear device, the load detection system provided in the present application may also be used to determine whether the to-be-detected load is a charging wire or a charging wire plus a charging device.

The present application discloses a load detection system. The load detection system includes an adjustable power supply and a detection module. The adjustable power supply and a to-be-detected load together form a set load detection circuit, and the adjustable power supply is configured to output a changing power supply signal to the to-be-detected load through the set load detection circuit. The detection module is configured to detect at least two changing electrical parameters in the set load detection circuit and detect whether the to-be-detected load includes a charging device according to a non-linear change curve or a linear change curve formed by the equivalent resistance value and the power supply signal. The load detection system and the load detection method thereof disclosed in the present application avoid a case in which a detection system having a mechanical structure cannot detect whether a charging device is inserted after detecting that a charging wire has been inserted into the detection system and a case in which the detection system, according to the impedance change, mistakenly determines the insertion of a charging wire to be the insertion of a charging device, thereby accurately detecting whether the charging wire is inserted into the load detection system or whether both the charging wire and the charging device are inserted into the load detection system In an embodiment, the detection module 12 is configured to detect the at least two changing electrical parameters in the set load detection circuit 11 at intervals of set time.

In an embodiment, the to-be-detected load may also be a time-variant system because the charging wire may be inserted before a charging device is inserted in the actual situation. The adjustable power supply 110 outputs a changing power supply signal. The detection module 12 detects, at intervals of set time, at least two changing parameters in the load detection circuit under different power supply signals, calculates an equivalent resistance value of the to-be-detected load according to the detected changing electrical parameters through a preset algorithm, and further detects whether the to-be-detected load includes a charging device according to a non-linear change curve or a linear change curve formed by the equivalent resistance value and the power supply signal.

In an embodiment, the adjustable power supply may be an adjustable voltage source, and the changing electrical parameters include an output voltage of the adjustable voltage source and a load voltage across the to-be-detected load.

Figure 2:
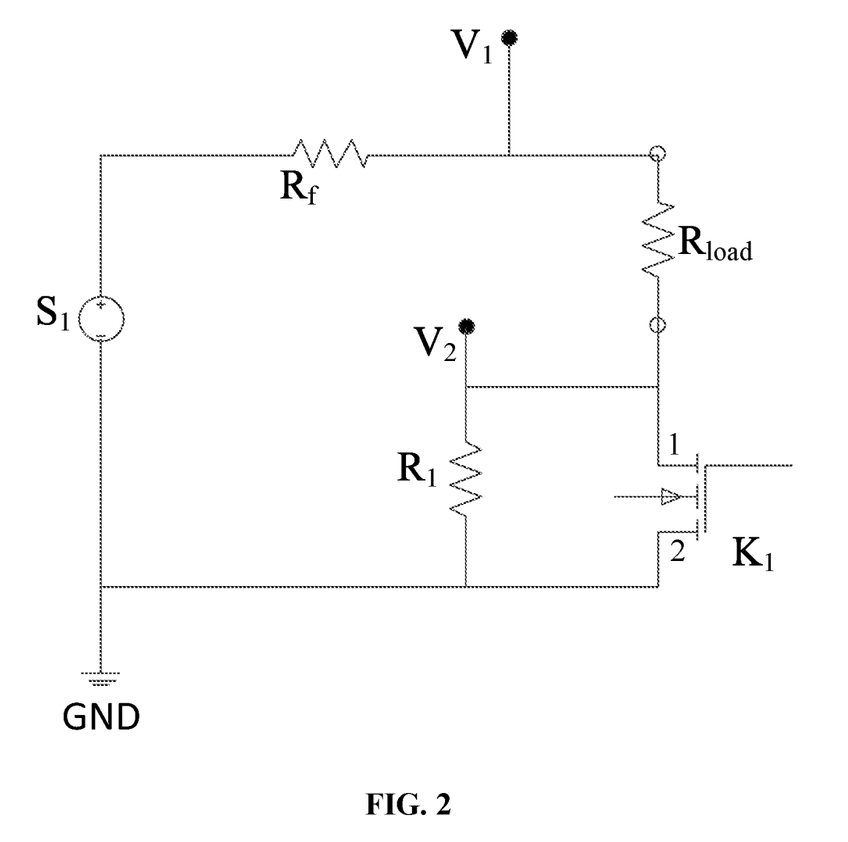
FIG. 2 is a structural diagram of a set load detection circuit in a case where an adjustable power supply is an adjustable voltage source according to an embodiment of the present application.

FIG. 2 is a structural diagram of a set load detection circuit in a case where an adjustable power supply is an adjustable voltage source according to an embodiment of the present application.

As shown in FIGS. 1 and 2, the set load detection circuit 11 further includes a reference impedance element $R_f$. A positive electrode of the adjustable voltage source $S_1$ is electrically connected to a first end of the reference impedance element $R_f$, a second end of the reference impedance element $R_f$ is electrically connected to a first end of the to-be-detected load $R_{load}$, and a second end of the to-be-detected load $R_{load}$ is electrically connected to a negative electrode of the adjustable voltage source $S_1$. The detection module 12 is configured to acquire the equivalent resistance value of the to-be-detected load according to the output voltage of the adjustable voltage source $S_1$, the load voltage across the to-be-detected load $R_{load}$, and the equivalent resistance value of the to-be-detected load $R_f$.

In an embodiment, as shown in FIGS. 1 and 2, the set load detection circuit 11 further includes a first switch element $K_1$ and a first wake-up impedance element $R_1$. The detection module 12 is further configured to detect a voltage at a voltage changing end of the first wake-up impedance element $R_1$ and determine, according to the detected voltage, whether to wake up the load detection system to detect a type of the to-be-detected load 120. With reference to FIG. 2, a first end of the first switch element $K_1$ is electrically connected to the second end of the to-be-detected load $R_{load}$, a second end of the first switch element $K_1$ is electrically connected to the negative electrode of the adjustable voltage source $S_1$. Exemplarily, the negative electrode of the adjustable voltage source $S_1$ is grounded, and the second end of the to-be-detected load $R_{load}$ is electrically connected to the negative electrode of the adjustable voltage source $S_1$ through the first wake-up impedance element $R_1$.

The first end of the first switch element $K_1$ is the source of the MOS transistor, the second end of the first switching element $K_1$ is the drain of the MOS transistor, and the gate of the first switching element $K_1$ is connected to the detection module 12 (not shown in the figure).

In an embodiment, as shown in FIGS. 1 and 2, the reference impedance element $R_f$ is both an impedance measurement reference resistor and a current limiting resistor, where the resistance values of the impedance measurement reference resistor and the current limiting resistor are selected by referring to the central value of the resistance value of the to-be-detected load $R_{load}$, and the resistance values of the both may be set to be approximately equivalent to each other. $V_1$ is a first voltage measurement point, which is electrically connected to the detection module 12 and configured to measure the result of voltage division between the to-be-detected load $R_{load}$ and the reference impedance element $R_f$. The resistance value of the first wake-up impedance element $R_1$ is much larger than the equivalent resistance value of the to-be-detected load $R_{load}$. $V_2$ is a second voltage measurement point.

In an embodiment, as shown in FIGS. 1 and 2, when the set load detection circuit 11 is standby, the load interface is not connected to the to-be-detected load $R_{load}$, the set load detection circuit is equivalent to an open circuit, and the resistance value at the load interface is infinitely large. Since the resistance value of the first wake-up impedance element $R_1$ is far larger than the equivalent resistance value of the to-be-detected load $R_{load}$, the voltage at the second voltage measurement point $V_2$ is low. In this case, the detection module 12 controls the first switch element $K_1$ to be in an OFF state, the adjustable voltage source $S_1$ outputs a fixed voltage, and the load detection system is in a low-power standby mode. The first switch element $K_1$, the first wake-up impedance element $R_1$, and the second voltage measurement point $V_2$ are the detection mechanism for detecting whether the charging device is inserted when the load detection system is standby.

After the to-be-detected load $R_{load}$ is connected to the set load detection circuit 11 and since the resistance value of the first wake-up impedance element $R_1$ is much larger than the equivalent resistance value of the to-be-detected load $R_{load}$, the voltage at the second voltage measurement point $V_2$ changes from low to high, and the detection module 12 wakes the load detection system up after detecting the voltage change at the second voltage measurement point $V_2$.

It is to be noted that the "waking the system up" means that the detection module detects that the to-be-detected load $R_{load}$ is connected to the set load detection circuit 11, controls the adjustable voltage source $S_1$ to output a voltage signal, and controls the first switch element $K_1$ to be turned on, and the system that is going to perform detection starts to detect the to-be-detected load $R_{load}$.

After the load detection system is woken up, the first switch element $K_1$ is turned on, and the adjustable voltage source $S_1$ outputs a changing power supply signal, where the voltage value of the power supply signal is $V_{rk}$. Since different $V_r$ correspond to different $R_{load}$, the obtained equivalent impedance is non-linear with the power supply signal outputted from the adjustable voltage source. The detection module 12 measures the voltage value $V_{tk}$ at the first voltage measurement point $V_1$, where k represents the number of measurements, calculates the equivalent resistance value of the to-be-detected load $R_{load}$ through the formula $$R_{load\ k} = \frac{V_{tk}}{V_{rk} - V_{tk}} R_f,$$

and determines whether the connected to-be-detected load is the charging wire or the charging wire plus charging device according to the non-linear change curve or linear change curve of the equivalent resistance value of the to-be-detected load $R_{load}$ changing with the voltage value outputted by the adjustable voltage source $S_1$.

Figure 3:
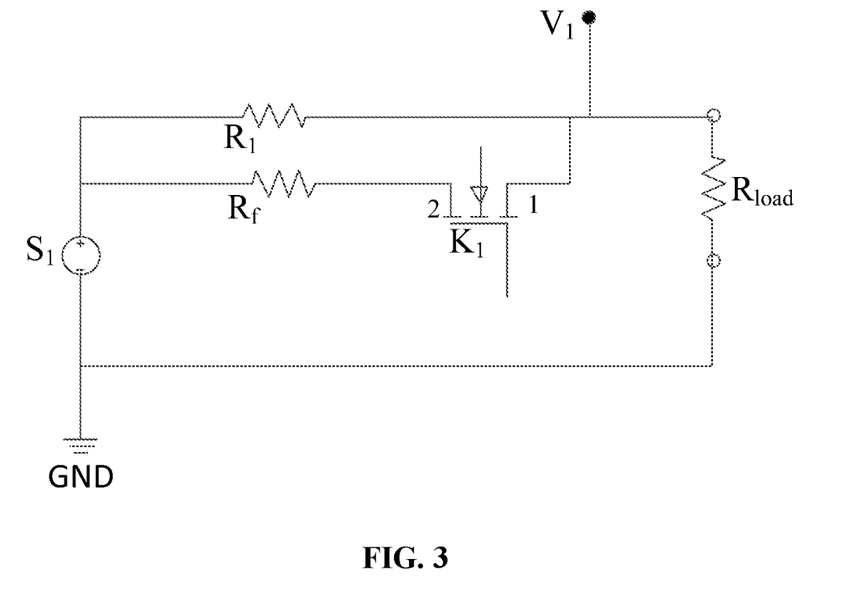
FIG. 3 is a structural diagram of another set load detection circuit in a case where an adjustable power supply is an adjustable voltage source according to an embodiment of the present application.

FIG. 3 is a structural diagram of another set load detection circuit in a case where an adjustable power supply is an adjustable voltage source according to an embodiment of the present application.

On the basis of the set load detection circuit shown in FIG. 2, the set load detection circuit may also has the configuration shown in FIG. 3. As shown in FIG. 3, the second end of the reference impedance element $R_f$ is electrically connected to the first end of the to-be-detected load $R_{load}$ through the first switch element $K_1$, the first end of the first switch element $K_1$ is electrically connected to the first end of the to-be-detected load $R_{load}$, the second end of the first switch element $K_1$ is electrically connected to the second end of the reference impedance element, a first end of the first wake-up impedance element $R_1$ is electrically connected to the positive electrode of the adjustable voltage source $S_1$, and a second end of the first wake-up impedance element $R_1$ is electrically connected to the first end of the to-be-detected load $R_{load}$.

In an embodiment, as shown in FIGS. 1 and 3, when the set load detection circuit 11 is standby, the load interface is not connected to the to-be-detected load $R_{load}$, the set load detection circuit is equivalent to an open circuit, and the resistance value at the load interface is infinitely large. Since the resistance value of the first wake-up impedance element $R_1$ is far larger than the equivalent resistance value of the to-be-detected load $R_{load}$, the voltage at the first voltage measurement point $V_1$ is high. In this case, the first switch element $K_1$ is in an OFF state, the adjustable voltage source $S_1$ outputs a fixed voltage, and the load detection system is in a low-power standby mode. The first switch element $K_1$, the first wake-up impedance element $R_1$, and the first voltage measurement point $V_1$ are the detection mechanism for detecting whether the charging device is inserted when the load detection system is on standby.

After the to-be-detected load $R_{load}$ is connected to the set load detection circuit 11 since the resistance value of the first wake-up impedance element $R_1$ is much larger than the equivalent resistance value of the to-be-detected load $R_{load}$, the voltage at the first voltage measurement point $V_1$ changes from high to low, and the detection module 12 wakes the load detection system up after detecting the voltage change at the first voltage measurement point $V_1$. It is to be noted that the "waking the system up" means that the detection module detects that the to-be-detected load $R_{load}$ is connected to the set load detection circuit 11, controls the adjustable voltage source $S_1$ to output a voltage signal and controls the first switch element $K_1$ to be turned on, and the system that is going to perform detection starts to detect the to-be-detected load $R_{load}$.

After the load detection system is woken up, the first switch element $K_1$ is turned on, and the adjustable voltage source $S_1$ outputs a changing power supply signal, where the voltage value of the power supply signal is $V_{rk}$. Since different $V_r$ correspond to different $R_{load}$, the obtained equivalent impedance is non-linear with the power supply signal outputted from the adjustable voltage source. The detection module 12 measures the voltage value $V_{tk}$ at the first voltage measurement point $V_1$, where k represents the number of measurements, calculates the equivalent resistance value of the to-be-detected load $R_{load}$ through the formula $$R_{load\ k} = \frac{V_{tk}}{V_{rk} - V_{tk}} R_f,$$

and determines whether the connected to-be-detected load is the charging wire or the charging wire plus charging device according to the non-linear change curve or linear change curve of the equivalent resistance value of the to-be-detected load $R_{load}$ changing with the voltage value outputted by the adjustable voltage source $S_1$.

It is to be noted that with reference to the set load detection circuit shown in FIG. 3, since the resistance value of the first wake-up impedance element $R_1$ is large and is about at the level of megohms while the resistance value of the reference impedance element $R_f$ is only at the level of kilohms, the resistance value of the first wake-up impedance element $R_1$ connected in parallel with the reference impedance element $R_f$ can be ignored with respect to the reference impedance element $R_f$. Therefore, when the equivalent resistance value of the to-be-detected load $R_{load}$ is calculated through the formula $$R_{load\ k} = \frac{V_{tk}}{V_{rk} - V_{tk}} R_f,$$

the resistance value of the first wake-up impedance element $R_1$ is ignored.

In an embodiment, the adjustable power supply may be an adjustable current source, and the changing electrical parameters include an output current of the adjustable current source and the load voltage across the to-be-detected load.

Figure 4:
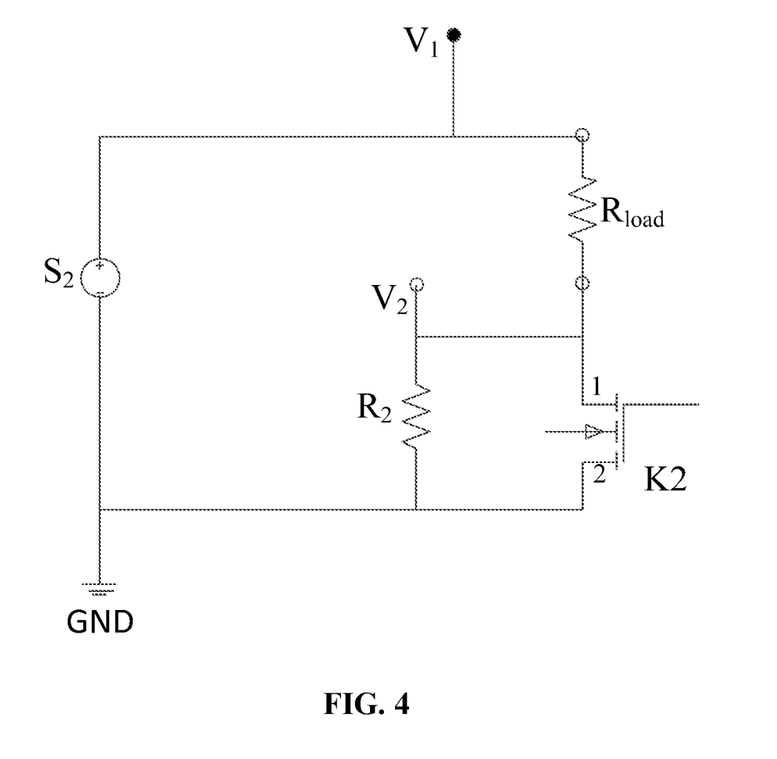
FIG. 4 is a structural diagram of a set load detection circuit in a case where an adjustable power supply is an adjustable current source according to an embodiment of the present application.

FIG. 4 is a structural diagram of a set load detection circuit in a case where an adjustable power supply is an adjustable current source according to an embodiment of the present application.

As shown in FIGS. 1 and 4, a positive electrode of the adjustable current source $S_2$ is electrically connected to the first end of the to-be-detected load $R_{load}$, and the second end of the to-be-detected load $R_{load}$ is electrically connected to a negative electrode of the adjustable current source $S_2$. Then the detection module 12 is configured to obtain an equivalent resistance value of the to-be-detected load $R_{load}$ according to the output current of the adjustable current source $S_2$ and the load voltage across the to-be-detected load $R_{load}$.

In an embodiment, as shown in FIGS. 1 and 4, the set load detection circuit 11 further includes a second switch element $K_2$ and a second wake-up impedance element $R_2$. The detection module 12 is further configured to detect a voltage at a voltage changing end of the second wake-up impedance element $R_2$ and determine, according to the detected voltage, whether to wake up the load detection system to detect a type of the to-be-detected load $R_{load}$. With reference to FIG. 2, a first end of the second switch element $K_2$ is electrically connected to the second end of the to-be-detected load $R_{load}$, a second end of the second switch element $K_2$ is electrically connected to the negative electrode of the adjustable current source $S_2$. Exemplarily, the negative electrode of the adjustable current source $S_2$ is grounded, and the second end of the to-be-detected load $R_{load}$ is electrically connected to the negative electrode of the adjustable current source $S_2$ through the second wake-up impedance element $R_2$.

The first end of the second switch element $K_2$ is the source of the MOS transistor, the second end of the second switch element $K_2$ is the drain of the MOS transistor, and the gate of the second switch element $K_2$ is connected to the detection module 12 (not shown in the figure).

In an embodiment, as shown in FIG. 4, $V_1$ is a first voltage measurement point, which is electrically connected to the detection module 12. Exemplarily, when the second end of the load interface is grounded, the first voltage measuring point $V_1$ is configured to measure the load voltage across the to-be-detected load $R_{load}$ The second switch element $K_2$ is a MOS transistor. The second wake-up impedance element $R_2$ is a bypass resistor of the second switch element $K_2$, and the resistance value of the second wake-up impedance element $R_2$ is much larger than the equivalent resistance value of the to-be-detected load $R_{load}$. $V_2$ is the second voltage measuring point.

In an embodiment, as shown in FIGS. 1 and 4, when the set load detection circuit 11 is standby, the load interface is not connected to the to-be-detected load $R_{load}$, the set load detection circuit is equivalent to an open circuit, and the resistance value at the load interface is infinitely large. Since the resistance value of the second wake-up impedance element $R_2$ is far larger than the equivalent resistance value of the to-be-detected load $R_{load}$, the voltage at the second voltage measurement point $V_2$ is low. In this case, the second switch element $K_2$ is in an OFF state, the adjustable current source $S_2$ outputs a fixed current, and the load detection system is in a low-power standby mode. The second switch element $K_2$, the second wake-up impedance element $R_2$, and the second voltage measurement point $V_2$ are the detection mechanism for detecting whether the charging device is inserted when the load detection system is on standby.

After the to-be-detected load $R_{load}$ is connected to the set load detection circuit 11 and since the resistance value of the second wake-up impedance element $R_2$ is much larger than the equivalent resistance value of the to-be-detected load $R_{load}$, the voltage at the second voltage measurement point $V_2$ changes from low to high, and the detection module 12 wakes the load detection system up after detecting the voltage change at the second voltage measurement point $V_2$. It is to be noted that the "waking the system up" means that the detection module detects that the to-be-detected load $R_{load}$ is connected to the set load detection circuit 11, controls the adjustable current source $S_2$ to output a current signal, and controls the second switch element $K_2$ to be turned on, and the system that is going to perform detection starts to detect the to-be-detected load $R_{load}$.

After the load detection system is woken up, the second switch element $K_2$ is turned on, and the adjustable current source $S_2$ outputs a changing power supply signal, where the current value of the power supply signal is $I_{rk}$. The detection module 12 measures the voltage value $V_{tk}$ at the first voltage measurement point $V_1$, where k represents the number of measurements, calculates the equivalent resistance value of the to-be-detected load $R_{load}$ through the formula $$R_{load\ k} = \frac{V_{tk}}{I_{rk}},$$

and determines whether the connected to-be-detected load is the charging wire or the charging wire plus charging device according to the non-linear change curve or linear change curve of the equivalent resistance value of the to-be-detected load $R_{load}$ changing with the current value outputted by the adjustable current source $S_2$.

Figure 5:
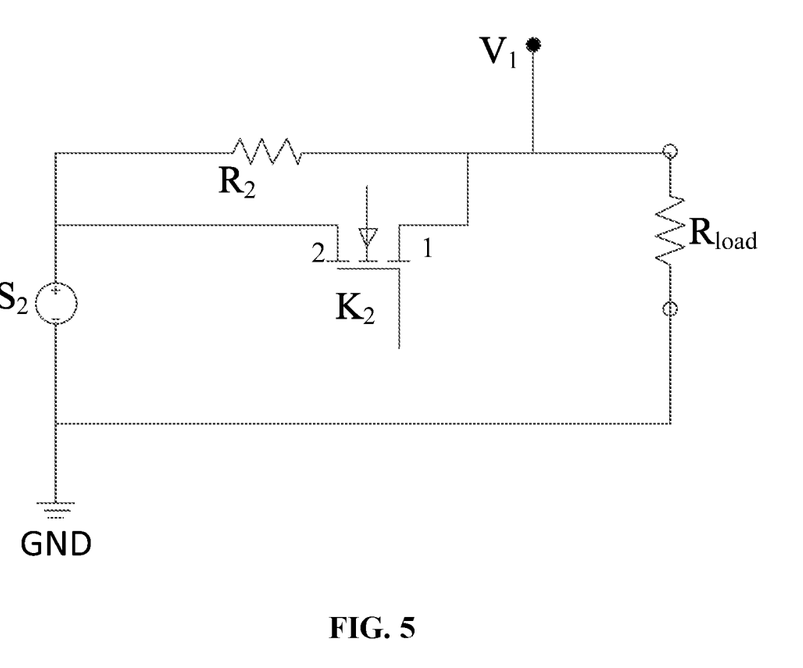
FIG. 5 is a structural diagram of another set load detection circuit in a case where an adjustable power supply is an adjustable current source according to an embodiment of the present application.

FIG. 5 is a structural diagram of another set load detection circuit in a case where an adjustable power supply is an adjustable current source according to an embodiment of the present application.

On the basis of the set load detection circuit shown in FIG. 4, the set load detection circuit may also have the configuration shown in FIG. 5. As shown in FIG. 5, the positive electrode of the adjustable current source $S_2$ is electrically connected to the first end of the to-be-detected load $R_{load}$ through the second wake-up impedance element $R_2$, the first end of the second switch element $K_2$ is electrically connected to the first end of the to-be-detected load $R_{load}$, and the second end of the second switch element $K_2$ is electrically connected to the positive electrode of the adjustable current source $S_2$.

In an embodiment, as shown in FIGS. 1 and 5, when the set load detection circuit 11 is standby, the load interface is not connected to the to-be-detected load $R_{load}$, the set load detection circuit is equivalent to an open circuit, and the resistance value at the load interface is infinitely large. Since the resistance value of the second wake-up impedance element $R_2$ is far larger than the equivalent resistance value of the to-be-detected load $R_{load}$, the voltage at the first voltage measurement point $V_1$ is high. In this case, the second switch element $K_2$ is in an OFF state, the adjustable current source $S_2$ outputs a fixed current, and the load detection system is in a low-power standby mode. The second switch element $K_2$, the second wake-up impedance element $R_2$, and the first voltage measurement point $V_1$ are the detection mechanism for detecting whether the charging device is inserted when the load detection system is on standby.

After the to-be-detected load $R_{load}$ is connected to the set load detection circuit 11 and since the resistance value of the second wake-up impedance element $R_2$ is much larger than the equivalent resistance value of the to-be-detected load $R_{load}$, the voltage at the first voltage measurement point $V_1$ changes from high to low, and the detection module 12 wakes the load detection system up after detecting the voltage change at the first voltage measurement point $V_1$. It is to be noted that the "waking the system up" means that the detection module detects that the to-be-detected load $R_{load}$ is connected to the set load detection circuit 11, controls the adjustable current source $S_2$ to output a current signal, and controls the second switch element $K_2$ to be turned on, and the system that is going to perform detection starts to detect the to-be-detected load $R_{load}$.

After the load detection system is woken up, the second switch element $K_2$ is turned on, and the adjustable current source $S_2$ outputs a changing power supply signal, where the current value of the power supply signal is $I_{rk}$. The detection module 12 measures the voltage value $V_{tk}$ at the first voltage measurement point $V_1$, where k represents the number of measurements, calculates the equivalent resistance value of the to-be-detected load $R_{load}$ through the formula $$R_{load\ k} = \frac{V_{tk}}{I_{rk}},$$

and determines whether the connected to-be-detected load is the charging wire or the charging wire plus charging device according to the non-linear change curve or linear change curve of the equivalent resistance value of the to-be-detected load $R_{load}$ changing with the current value outputted by the adjustable current source $S_2$.

In an embodiment, the detection module 12 is further configured to detect an oscillation parameter of a voltage across the to-be-detected load $R_{load}$ and determine the type of the to-be-detected load according to the detected oscillation parameter.

In an embodiment, when the adjustable power supply 110 outputs a changing power supply signal to the to-be-detected load 120, different to-be-detected loads may exhibit oscillation under different voltage segments. In a process of detecting the to-be-detected load using the load detection system, the detection module 12 may further detect an oscillation parameter of a voltage across the to-be-detected load $R_{load}$, where the oscillation parameter may be an oscillation amplitude value, an oscillation voltage value, an output value of the adjustable power supply when the oscillation phenomenon occurs, and the like. Meanwhile, the detection module 12 also measures an oscillation period and compares the detected parameters with a respective pre-stored standard parameter in the database to determine the type of the to-be-detected device.

It is to be noted that the type of the to-be-detected device refers to a type or a model of the to-be-detected device. For example, the type of the to-be-detected device may be devices that need to be charged, such as mobile phones, bracelets, tablet computers, and table lamps, but are not limited to the type listed above. The model of the to-be-detected device refers to different models of a certain product of the same brand, for example, different models of mobile phones of the same brand.

In the present application, the detection module 12 can accurately determine the type of the to-be-detected load through the detected electrical performance parameters across the to-be-detected load $R_{load}$, that is, the above-mentioned oscillation parameter.

Figure 6:
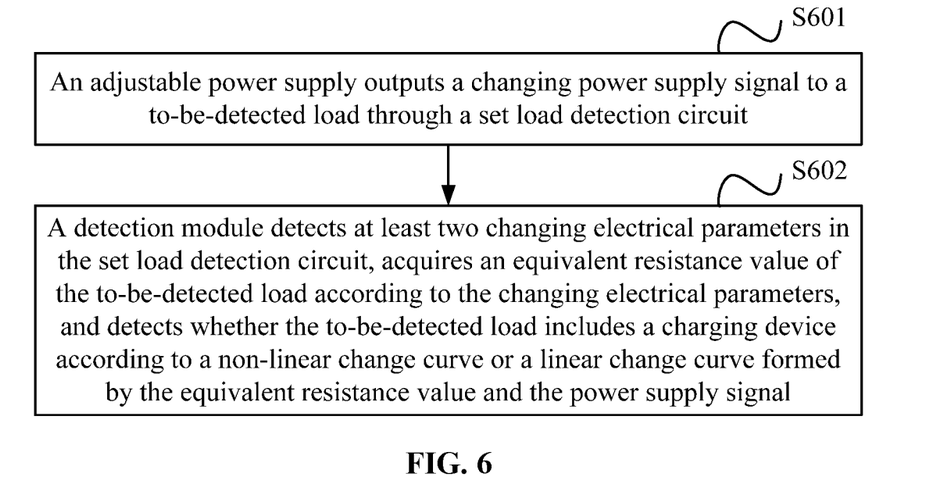
FIG. 6 is a flowchart of a load detection method according to an embodiment of the present application.

The present application further provides a load detection method of the above-mentioned load detection system. FIG. 6 is a flowchart of a load detection method according to an embodiment of the present application. As shown in FIG. 6, the load detection method includes steps S601 and S602.

In step S601, an adjustable power supply outputs a changing power supply signal to a to-be-detected load through a set load detection circuit.

In step S602, a detection module detects at least two changing electrical parameters in the set load detection circuit, acquires an equivalent resistance value of the to-be-detected load according to the changing electrical parameters, and detects whether the to-be-detected load includes a charging device according to a non-linear change curve or a linear change curve formed by the equivalent resistance value and the power supply signal.

In an embodiment, the adjustable power supply outputs a changing power supply signal, and the detection module detects at least two changing parameters in the set load detection circuit and calculates an equivalent resistance value of the to-be-detected load according to the detected changing electric parameters through a preset algorithm. The change curve of the equivalent resistance value changing with the power supply signal outputted by the adjustable power supply may be a non-linear change curve and may also be a linear change curve. Apparently, the linear change curve of the inserted charging wire is different from the linear change curve or the non-linear change curve of the inserted charging wire plus the charging device.

When a charging wire is inserted before a charging device is inserted because to-be-detected loads that are inserted in sequence and that are detected at different times are different, the detection module can obtain different linear change curves or non-linear change curves, then determine whether the to-be-detected load at the load interface changes according to the obtained different linear change curves or non-linear change curves, and further determine whether the to-be-detected load is the charging wire or the charging wire plus the charging device.

In the present application, the characteristics of the non-linear system or the linear system can be obtained by detecting the to-be-detected load, that is, by detecting the non-linear system or the linear system, and since the characteristics of different non-linear systems or linear systems are different, different non-linear systems or different states of the same non-linear system can be distinguished, or different linear systems or different states of the same linear system can be distinguished. The load detection method of the present application can accurately detect whether the charging wire is inserted into the interface or whether both the charging wire and the charging device are inserted into the interface.

In the description of the present application, unless otherwise explicitly specified and limited, the term "mounted", "connected to each other", or "connected" is to be construed in a broad sense as, for example, securely connected, detachably connected, or integrated; mechanically connected or electrically connected; directly connected to each other or indirectly connected to each other via an intermediary; or intra-connected between two components. For those of ordinary skill in the art, specific meanings of the above terms in the present utility model can be understood according to specific conditions.

What is claimed is:

1. A load detection system, comprising a set load detection circuit and a detection circuit; wherein
    the set load detection circuit comprises an adjustable power supply and a to-be-detected load, wherein the adjustable power supply is configured to output a changing power supply signal to the to-be-detected load through the set load detection circuit; and
    the detection circuit is configured to detect at least two changing electrical parameters in the set load detection circuit, to acquire an equivalent resistance value of the to-be-detected load according to the at least two changing electrical parameters, and to detect whether the to-be-detected load comprises a charging device according to a non-linear change curve formed by the equivalent resistance value and the power supply signal or a linear change curve formed by the equivalent resistance value and the power supply signal.

2. The load detection system of claim 1, wherein the detection circuit is configured to detect the at least two changing electrical parameters in the set load detection circuit at intervals of set time.

3. The load detection system of claim 2, wherein the adjustable power supply is an adjustable voltage source, and the at least two changing electrical parameters comprise an output voltage of the adjustable voltage source and a load voltage across the to-be-detected load.

4. The load detection system of claim 2, wherein the adjustable power supply is an adjustable current source, and the at least two changing electrical parameters comprise an output current of the adjustable current source and a load voltage across the to-be-detected load.

5. The load detection system of claim 1, wherein the adjustable power supply is an adjustable voltage source, and the at least two changing electrical parameters comprise an output voltage of the adjustable voltage source and a load voltage across the to-be-detected load.

6. The load detection system of claim 5, wherein the set load detection circuit further comprises:
    a reference impedance element, wherein a positive electrode of the adjustable voltage source is electrically connected to a first end of the reference impedance element, a second end of the reference impedance element is electrically connected to a first end of the to-be-detected load, and a second end of the to-be-detected load is electrically connected to a negative electrode of the adjustable voltage source; and
    the detection circuit is configured to acquire the equivalent resistance value of the to-be-detected load according to the output voltage of the adjustable voltage source, the load voltage across the to-be-detected load, and a resistance value of the reference impedance element.

7. The load detection system of claim 6, wherein the set load detection circuit further comprises: a first switch element and a first wake-up impedance element; wherein
the detection circuit is further configured to detect a voltage at a voltage changing end of the first wake-up impedance element, and to determine whether to wake up the load detection system according to the detected voltage, so as to detect a type of the to-be-detected load; and
a first end of the first switch element is electrically connected to the second end of the to-be-detected load, a second end of the first switch element is electrically connected to the negative electrode of the adjustable voltage source, and the second end of the to-be-detected load is electrically connected to the negative electrode of the adjustable voltage source through the first wake-up impedance element; or,
the second end of the reference impedance element is electrically connected to the first end of the to-be-detected load through the first switch element, a first end of the first switch element is electrically connected to the first end of the to-be-detected load, a second end of the first switch element is electrically connected to the second end of the reference impedance element, a first end of the first wake-up impedance element is electrically connected to the positive electrode of the adjustable voltage source, and a second end of the first wake-up impedance element is electrically connected to the first end of the to-be-detected load.

8. The load detection system of claim 1, wherein the adjustable power supply is an adjustable current source, and the at least two changing electrical parameters comprise an output current of the adjustable current source and a load voltage across the to-be-detected load.

9. The load detection system of claim 8, wherein a positive electrode of the adjustable current source is electrically connected to a first end of the to-be-detected load, and a second end of the to-be-detected load is electrically connected to a negative electrode of the adjustable current source; and
the detection circuit is configured to obtain the equivalent resistance value of the to-be-detected load according to the output current of the adjustable current source and the load voltage across the to-be-detected load.

10. The load detection system of claim 9, wherein the set load detection circuit further comprises: a second switch element and a second wake-up impedance element;
the detection circuit is further configured to detect a voltage at a voltage changing end of the second wake-up impedance element, and to determine whether to wake up the load detection system according to the detected voltage, so as to detect a type of the to-be-detected load; and
a first end of the second switch element is electrically connected to the second end of the to-be-detected load, a second end of the second switch element is electrically connected to a negative electrode of the adjustable voltage source, and the second end of the to-be-detected load is electrically connected to the negative electrode of the adjustable current source through the second wake-up impedance element; or,
the positive electrode of the adjustable current source is electrically connected to the first end of the to-be-detected load through the second wake-up impedance element, a first end of the second switch element is electrically connected to the first end of the to-be-detected load, and a second end of the second switch element is electrically connected to the positive electrode of the adjustable current source.

11. The load detection system of claim 1, wherein the detection circuit is further configured to detect an oscillation parameter of a voltage across the to-be-detected load and to determine a type of the to-be-detected load according to the detected oscillation parameter.

12. A load detection method of a load detection system, comprising:
outputting, by an adjustable power supply, a changing power supply signal to a to-be-detected load through a set load detection circuit; and
detecting, by a detection circuit, at least two changing electrical parameters in the set load detection circuit, acquiring an equivalent resistance value of the to-be-detected load according to the at least two changing electrical parameters, and detecting whether the to-be-detected load comprises a charging device according to a non-linear change curve or a linear change curve formed by the equivalent resistance value and the power supply signal.

13. The method of claim 12, wherein detecting, by the detection circuit, the at least two changing electrical parameters in the set load detection circuit comprises:
detecting, by the detection circuit, the at least two changing electrical parameters in the set load detection circuit at intervals of set time.

14. The method of claim 12, wherein the adjustable power supply is an adjustable voltage source, and the at least two changing electrical parameters comprise an output voltage of the adjustable voltage source and a load voltage across the to-be-detected load.

15. The method of claim 14, wherein the set load detection circuit further comprises a reference impedance element, wherein a positive electrode of the adjustable voltage source is electrically connected to a first end of the reference impedance element, a second end of the reference impedance element is electrically connected to a first end of the to-be-detected load, and a second end of the to-be-detected load is electrically connected to a negative electrode of the adjustable voltage source;
wherein acquiring the equivalent resistance value of the to-be-detected load according to the at least two changing electrical parameters comprises:
acquiring the equivalent resistance value of the to-be-detected load according to the output voltage of the adjustable voltage source, the load voltage across the to-be-detected load, and a resistance value of the reference impedance element.

16. The method of claim 15, wherein the set load detection circuit further comprises: a first switch element and a first wake-up impedance element; and the method further comprises:
detecting, by the detection circuit, a voltage at a voltage changing end of the first wake-up impedance element, and determining whether to wake up the load detection system according to the detected voltage so as to detect a type of the to-be-detected load;
wherein, a first end of the first switch element is electrically connected to the second end of the to-be-detected load, a second end of the first switch element is electrically connected to the negative electrode of the adjustable voltage source, and the second end of the to-be-detected load is electrically connected to the negative electrode of the adjustable voltage source through the first wake-up impedance element or, the second end of the reference impedance element is electrically connected to the first end of the to-be-detected load through the first switch element, a first end of the first switch element is electrically connected to the first end of the to-be-detected load, a second end of the first switch element is electrically connected to the second end of the reference impedance element, a first end of the first wake-up impedance element is electrically connected to the positive electrode of the adjustable voltage source, and a second end of the first wake-up impedance element is electrically connected to the first end of the to-be-detected load.

17. The method of claim 12, wherein the adjustable power supply is an adjustable current source, and the at least two changing electrical parameters comprise an output current of the adjustable current source and a load voltage across the to-be-detected load.

18. The method of claim 17, wherein a positive electrode of the adjustable current source is electrically connected to a first end of the to-be-detected load, and a second end of the to-be-detected load is electrically connected to a negative electrode of the adjustable current source; and wherein acquiring the equivalent resistance value of the to-be-detected load according to the at least two changing electrical parameters comprises:

obtaining the equivalent resistance value of the to-be-detected load according to the output current of the adjustable current source and the load voltage across the to-be-detected load.

19. The method of claim 18, wherein the set load detection circuit further comprises: a second switch element and a second wake-up impedance element, and the method further comprises:

detecting, by the detection circuit, a voltage at a voltage changing end of the second wake-up impedance element, and determining whether to wake up the load detection system according to the detected voltage so as to detect a type of the to-be-detected load;

wherein a first end of the second switch element is electrically connected to the second end of the to-be-detected load, a second end of the second switch element is electrically connected to a negative electrode of the adjustable voltage source, and the second end of the to-be-detected load is electrically connected to the negative electrode of the adjustable current source through the second wake-up impedance element; or, the positive electrode of the adjustable current source is electrically connected to the first end of the to-be-detected load through the second wake-up impedance element, a first end of the second switch element is electrically connected to the first end of the to-be-detected load, and a second end of the second switch element is electrically connected to the positive electrode of the adjustable current source.

20. The method of claim 12, comprising:

detecting, by the detection circuit, an oscillation parameter of a voltage across the to-be-detected load; and determining a type of the to-be-detected load according to the detected oscillation parameter.

* * * * *